United States Patent [19]

VanSlyke et al.

[11] Patent Number: 5,061,569
[45] Date of Patent: Oct. 29, 1991

[54] ELECTROLUMINESCENT DEVICE WITH ORGANIC ELECTROLUMINESCENT MEDIUM

[75] Inventors: Steven A. VanSlyke; Ching W. Tang, both of Rochester, N.Y.; Michael E. O'Brien, Madison, Wis.; Chin H. Chen, Fairport, N.Y.

[73] Assignee: Eastman Kodak Company, Rochester, N.Y.

[21] Appl. No.: 561,552

[22] Filed: Jul. 26, 1990

[51] Int. Cl.[5] .......................... H01J 1/62; H05B 33/14
[52] U.S. Cl. ................................ 428/457; 252/301.16; 313/504; 313/506; 428/515; 428/690; 428/917
[58] Field of Search ............... 428/690, 917, 457, 515; 313/504, 506; 252/301.16

[56] References Cited

U.S. PATENT DOCUMENTS

| | | | |
|---|---|---|---|
| 3,530,325 | 9/1976 | Mehl et al. | 313/108 |
| 3,567,450 | 3/1971 | Brantly et al. | 430/73 |
| 3,621,321 | 11/1971 | Williams | 313/108 |
| 3,658,520 | 4/1972 | Brantly et al. | 430/73 |
| 4,356,429 | 10/1982 | Tang | 313/504 |
| 4,539,507 | 9/1985 | VanSlyke et al. | 313/504 |
| 4,720,432 | 1/1988 | VanSlyke et al. | 428/917 |
| 4,769,292 | 9/1988 | Tang et al. | 428/690 |
| 4,885,211 | 12/1989 | Tang et al. | 428/917 |
| 4,950,950 | 8/1990 | Perry et al. | 428/690 |

Primary Examiner—James J Seidleck
Attorney, Agent, or Firm—Carl O. Thomas

[57] ABSTRACT

An internal junction organic electroluminescent device is disclosed comprising in sequence, an anode, an organic hold injecting and transporting zone, an organic electron injecting and transporting zone, and a cathode. The hole injecting and transporting zone includes a tertiary amine containing at least two tertiary amine moieties and including attached to a tertiary amine nitrogen atom an aromatic moiety containing at least two fused aromatic rings.

22 Claims, 1 Drawing Sheet

ELECTROLUMINESCENT DEVICE WITH ORGANIC ELECTROLUMINESCENT MEDIUM

FIELD OF THE INVENTION

This invention relates to organic electroluminescent devices. More specifically, this invention relates to organic electroluminescent devices which contain separate hole and electron transporting zones.

BACKGROUND OF THE INVENTION

Electroluminescent devices (hereinafter also referred to as EL devices) contain spaced electrodes separated by an electroluminescent medium that emits electromagnetic radiation, typically light, in response to the application of an electrical potential difference across the electrodes. The electroluminescent medium must not only be capable of luminescing, but must also be capable of fabrication in a continuous form (i.e., must be pin hole free) and must be sufficiently stable to facilitate fabrication and to support device operation.

Initially organic EL devices were fabricated using single crystals of organic materials, as illustrated by Mehl et al U.S. Pat. No. 3,530,325 and Williams U.S. Pat. No. 3,621,321. Because single crystal organic electroluminescent layers were relatively difficult to fabricate and further did not readily lend themselves to thin layer constructions in thicknesses below about 50 μm, the art turned to the use of thin film deposition techniques to form the organic layer of EL devices. Unfortunately, thin film deposition techniques produced devices which exhibited performance efficiencies 1 to 2 orders of magnitude below that obtained with single organic crystal devices.

In the last decade the art has developed a new class of organic EL devices hereinafter referred to as internal junction organic EL devices which lend themselves to thin film deposition techniques for fabrication of the organic layers and which exhibit performance characteristics comparable to or better than those of single organic crystal EL devices. This new class of organic EL devices has been made possible by dividing the organic medium separating the electrodes into a hole injecting and transporting zone and an electron injecting and transporting zone. The interface of the two organic zones constitute an internal Junction allowing injection of holes into the electron injecting and transporting zone for recombination and luminescence, but blocking electron injection into the hole injecting and transporting zone. Examples of internal Junction organic EL devices are provided by Tang U.S. Pat. No. 4,356,429, VanSlyke et al U.S. Pat. Nos. 4,539,507 and 4,720,432, and Tang et al U.S. Pat. Nos. 4,769,292 and 4,885,211.

One area of concern in the performance of internal Junction organic EL devices has been the decline of luminescence during the operating life of the device. If the device is driven at progressively higher voltages to keep luminescence to an invariant level, eventually a voltage level is required that cannot be conveniently supplied by the driving circuitry or which produces a field gradient (volts/cm) exceeding the dielectric breakdown strength of the layers separating the electrodes, resulting in a catastrophic failure of the device.

VanSlyke et al U.S. Pat. No. 4,539,507 recognized that tertiary amines (including diamines) containing phenyl or phenylene groups when employed to form the hole injecting and transporting zone of an internal Junction organic EL device increased the stability of light output and thereby increased operating life. VanSlyke et al U.S. Pat. No. 4,720,432 recognized that still higher levels of stability could be realized by fabricating the hole injecting and transporting zone as two layers: a hole injecting layer contacting the cathode and a contiguous hole transporting layer forming a Junction with the electron injecting and transporting zone. VanSlyke et al '432 employed a tertiary amine in the hole transporting layer and a porphyrinic compound of the type disclosed by Tang U.S. Pat. No. 4.356,429 in the hole injecting layer.

Brantly et al U.S. Pat. Nos. 3,567,450 and 3,658,520 (cited by VanSlyke et al U.S. Pat. No. 4,720,432) disclose triarylamines useful in electrophotographyic systems. At least one of the aryl substituents is further substituted and can be either a phenylene or naphthalene group.

Despite the improvements in internal Junction organic EL device operating life and overall luminescence afforded by the VanSlyke et al discoveries, the luminescence of internal junction organic EL devices still declines initially at a comparatively high rate. When a device is driven at a constant current, luminescence often declines sharply during the first few hours of operation with luminescence declining at a slower rate thereafter. For example, a typical EL device will exhibit half of its total luminescence loss over 300 hours of operation within the first 10 to 20 hours of operation, and most of the loss of luminescence within the first 10 to 20 hours occurs in the first 1 to 2 hours of operation.

RELATED PATENT APPLICATIONS

VanSlyke et al (I) U.S. Ser. No. 558,285, concurrently filed and commonly assigned, titled ELECTROLUMINESCENT DEVICE WITH IMPROVED CATHODE, discloses an internal Junction organic EL device comprised of a cathode containing a combination of magnesium and aluminum.

SUMMARY OF THE INVENTION

The present invention is directed to the discovery of internal junction organic EL devices that exhibit a higher percentage of initial luminescence levels over their operating life. More specifically, when driven at a constant current the internal junction organic EL devices of this invention retain a high percentage cf their initial luminescence after the first few hours of operation. For example, a luminescence after 50 to 100 hours of operation is typically in excess of 80 percent of initial luminescence. By having retained a high percentage of initial luminescence the internal Junction organic EL devices of this invention emit at significantly higher intensities than comparable prior art devices over their first several hundred hours of operation.

In one aspect this invention is directed to an internal junction organic electroluminescent device comprising in sequence, an anode, an organic hole injecting and transporting zone comprised of a layer containing a hole transporting aromatic tertiary amine, an organic electron injecting and transporting zone, and a cathode. The invention is characterized in that the hole transporting aromatic tertiary amine is comprised of at least two tertiary amine moieties and includes attached to a tertiary amine nitrogen atom an aromatic moiety containing at least two fused aromatic rings.

BRIEF DESCRIPTION OF THE DRAWINGS

These and other advantages of this invention can be better appreciated by reference to the following detailed description considered in conjunction with the drawings, in which.

The drawings are necessarily of a schematic nature, since the thicknesses of the individual layers are too thin and thickness differences of the various device elements too great to permit depiction to scale or to permit convenient proportionate scaling.

DESCRIPTION OF PREFERRED EMBODIMENTS

Figure 1:
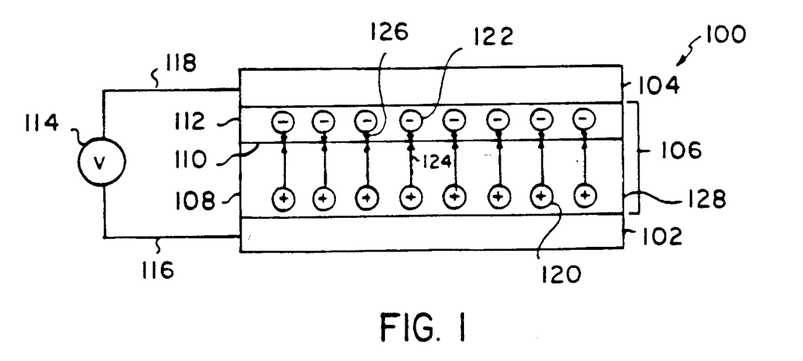
FIGS. 1, 2, and 3 are schematic diagrams of EL devices.

An internal junction organic electroluminescent (EL) device 100 according to the invention is schematically illustrated in FIG. 1. Anode 102 is separated from cathode 104 by an organic electroluminescent medium 106, which consists of a hole injecting and transporting zone 108 and an electron injecting and transporting zone 112. The two zones form a Junction 110 at their interface.

The anode and the cathode are connected to an external power source 114 by conductors 116 and 118, respectively. The power source can be a continuous direct current or alternating current voltage source or an intermittent current voltage source. Any convenient conventional power source, including any desired switching circuitry, can be employed which is capable of positively biasing the anode with respect to the cathode. Either the anode or cathode can be at ground potential.

The internal junction organic EL device can be viewed as a diode which is forward biased when the anode is at a higher potential than the cathode. Under these conditions injection of holes (positive charge carriers) occurs into the lower organic zone 108, as schematically shown at 120, while electrons are injected into the upper organic zone 112, as schematically shown at 122. The injected holes and electrons each migrate toward the oppositely charged electrode, as shown by the arrows 124 and 126, respectively. The holes cross the junction 110 resulting in hole electron recombination within the electron injecting and transporting zone 112. When a migrating electron drops from its conduction band potential to a valence band in filling a hole, energy is released as light. Depending upon the choice of alternative constructions, the released light can be emitted from the organic electroluminescent medium through one or more of edges 128 of the organic electroluminescent medium separating the electrodes, through the anode, through the cathode, or through any combination of the foregoing. Since the organic electroluminescent medium is quite thin, it is usually preferred to emit light through one of the two electrodes.

Reverse biasing of the electrodes reverses the direction of mobile charge migration, depletes the organic electroluminescent medium of mobile charge carriers, and terminates light emission. When an AC power source is employed, the internal junction organic EL devices are forward biased during a portion of each period and reverse biased during the remaining portion of the period.

Figure 2:
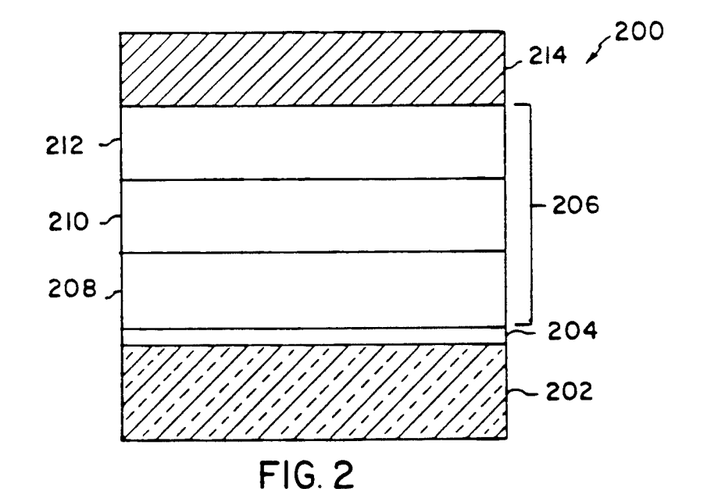

Internal junction organic EL device 200 shown in FIG. 2 is illustrative of one preferred embodiment of the invention. Because of the historical development of organic EL devices it is customary to employ a transparent anode. This is achieved by Providing a transparent insulative support 202 onto which is deposited a conductive light transmissive relatively high work function metal or metal oxide layer to form anode 204. The organic electroluminescent medium 206 consists of an organic electron injecting and transporting zone 212 in the form of a single layer corresponding to zone 112 in FIG. 1. The organic hole injecting and transmitting zone is divided into a hole injecting layer 208 and a hole transporting layer 210. The cathode 214 is conveniently formed by deposition on the upper layer of the organic electroluminescent medium.

Figure 3:
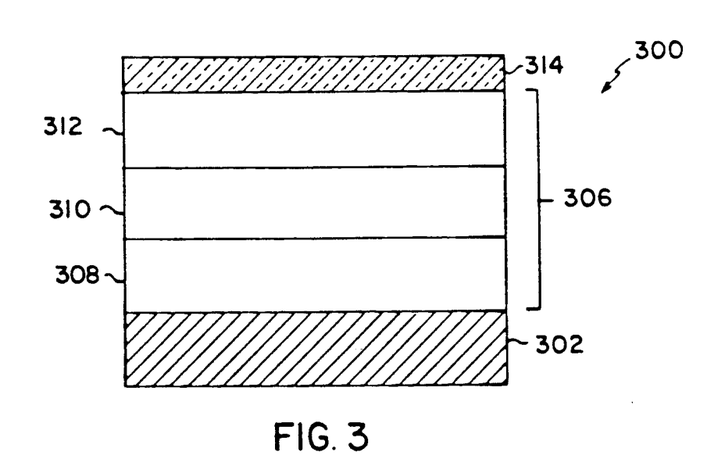

Internal junction organic EL device 300, shown in FIG. 3, is illustrative of another preferred embodiment of the invention. Contrary to the historical pattern of organic EL device development, light emission from the device 300 is through the light transmissive (e.g., transparent or substantially transparent) cathode 314. While the anode of the device 300 can be formed identically as the device 200, thereby permitting light emission through both anode and cathode, in the preferred form shown the device 300 employs an opaque charge conducting element forming the anode 302, such as a relatively high work function metallic substrate. The organic electroluminescent medium 306 and therefore each of its layers 308, 310, and 312 correspond to the medium 206 and layers 208, 210, and 212, respectively, and require no further description. The significant difference between devices 200 and 300 is that the latter employs a thin, light transmissive (e.g., transparent or substantially transparent) cathode in place of the opaque cathode customarily included in organic EL devices and, in most instances, employs an opaque anode instead of the light transmissive anode normally employed.

Viewing organic EL devices 200 and 300 together, it is apparent that the present invention offers the option of mounting the devices on either a positive or negative polarity opaque substrate.

At least two organic layers are required to form the organic electroluminescent medium of the internal junction organic EL devices of this invention. One Organic layer forms the electron injecting and transporting zone while at least one other organic layer is required to form the hole injecting and transporting zone.

The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. The present invention is based upon the discovery that specifically selected aromatic tertiary amines greatly improve the stability of device luminescence by exhibiting improved levels of stability near the outset of device operation and by exhibiting high levels of stability over the remainder of device operation. These advantages can be obtained when the selected aromatic tertiary amines are employed to fabricate the hole injecting and transporting zone in its entirety (as shown at 108 in FIG. 1) or the hole transporting layer (as shown at 210 and 310 in FIGS. 2 and 3) of the hole injecting and transporting zone.

The specifically selected aromatic tertiary amines found to be capable of improving the performance of the internal junction organic EL devices of this invention are those which (1) are comprised of at least two tertiary amine moieties and (2) include attached to a tertiary amine nitrogen atom an aromatic moiety containing at least two fused aromatic rings. The following is a listing of exemplary aromatic compounds containing at least two fused aromatic rings and from 10 to 24 ring carbon atoms:

Naphthalene,
Azulene,
Heptalene.
as-Indacene,
s-Indacene,
Acenaphthylene,
Phenalene,
Phenanthrene,
Anthracene,
Fluoranthrene,
Acephenathrylene,
Aceantrylene,
Triphenylene,
Pyrene,
Chrysene,
Naphthacene,
Pleiadene,
Picene,
Perylene,
Pentaphene,
Hexaphene,
Rubicene, and
Coronene.

The fused aromatic ring moieties of the tertiary amines preferably contain from about 10 to 16 ring carbon atoms. While unsaturated 5 and 7 membered rings can be fused to six membered aromatic rings (i.e., benzene rings) to form useful fused aromatic ring moieties, it is generally preferred that the fused aromatic ring moiety include at least two fused benzene rings. The simplest form of a fused aromatic ring moiety containing two fused benzene rings is naphthalene. Therefore, the preferred aromatic ring moieties present in the tertiary amines employed in this invention are naphthalene moieties, where the latter is understood to embrace all compounds containing a naphthalene ring structure. In monovalent form the naphthalene moieties are naphthyl moieties, and in their divalent form the naphthalene moieties are naphthylene moieties.

An aromatic ring carbon atom of the fused aromatic ring moiety is bonded directly to one of the tertiary nitrogen atoms of the selected aromatic tertiary amine. Since there are at least two tertiary amine moieties present in the selected aromatic tertiary amines employed in the practice of this invention, different relationships are possible. The fused aromatic ring moiety can be present as a substituent of one or more of the tertiary amine nitrogen atoms present in the selected tertiary amine, the fused aromatic ring moiety can form a divalent linkage between tertiary amine nitrogen atoms in the selected aromatic tertiary amine, and, when more than one fused aromatic ring moiety is present, both conditions can be satisfied in a single selected aromatic tertiary amine.

A preferred class of selected aromatic tertiary amines are those which include at least two aromatic tertiary amine moieties. Such compounds include those represented by structural formula (I):

wherein
 $Q^1$ and $Q^2$ are independently aromatic tertiary amine moieties and
 G is a linking group such as arylene, cyclo alkylene, or alkylene group or a carbon to carbon bond,
 at least one of $Q^1$, $Q^1$ and G including a fused aromatic ring moiety as described above. In a specifically preferred form each of $Q^1$ and $Q^2$ includes a fused aromatic ring moiety, optimally a fused naphthyl moiety, bonded to an amine nitrogen atom. When G is an arylene moiety, it is preferably a phenylene, biphenylene or naphthylene moiety.

A particularly preferred class of triaryl amines satisfying structural formula (I) and containing two triarylamine moieties are those satisfying structural formula (II):

where
 $R^1$ and $R^2$ each independently represents a hydrogen atom, an aryl group, or an alkyl group or $R^1$ and $R^2$ together represent the atoms completing a cycloalkyl group and
 $R^3$ and $R^4$ each independently represents an aryl group which is in turn substituted with a diaryl substituted amino group, as indicated by structural formula (III):

wherein $R^5$ and $R^6$ are independently selected aryl groups. At least one of the aryl groups attached to the amine nitrogen atom of formula (III) is a fused aromatic ring moiety as described above. In a specifically preferred form at least one $R^5$ and $R^6$ is a fused aromatic ring moiety, optimally a naphthyl moiety.

Another preferred class of selected aromatic tertiary amines are tetraaryldiamines. Preferred tetraaryldiamines include two diarylamino groups, such as indicated by formula (III), linked through an arylene group. Preferred tetraaryldiamines include those represented by formula (IV).

wherein
 Ar, $Ar^1$, $Ar^2$ and $Ar^3$ are independently selected from among phenyl, biphenyl and naphthyl moieties,
 L is a divalent naphthylene moiety or $\phi_n$,
 $\phi$ is a phenylene moiety,
 n is an integer of from 1 to 4, and at least one of Ar, $Ar^1$, $Ar^2$ and $Ar^3$ is a naphthyl moiety when L is $\phi_n$.

The various alkyl, alkylene, aryl, and arylene moieties of the foregoing structural formulae (I), (II), (III), and (IV) can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. When the aryl and arylene moieties are not fused aromatic ring moieties, they are preferably phenyl and phenylene moieties.

While the entire hole transporting layer of the organic electroluminescent medium can be formed of a single selected aromatic tertiary amine of the type described above, it is recognized that combinations of selected aromatic tertiary amines can be employed to advantage and that combinations of selected aromatic tertiary amines of the type described above with aromatic tertiary amines of the type disclosed by VanSlyke et al U.S. Pat. No. 4,720,432—i.e., aromatic tertiary amines lacking a fused aromatic ring moiety, can be employed. Apart from the differences specifically noted, the teachings of VanSlyke et al U.S. Pat. No. 4,720,432, here incorporated by reference, are generally applicable to the internal junction organic EL devices of this invention.

Illustrative of useful selected (fused aromatic ring containing) aromatic tertiary amines are the following:

| | |
|---|---|
| ATA-1 | 4,4'-Bis[N-(1-naphthyl)-N-phenylamino]-biphenyl |
| ATA-2 | 4,4''-Bis[N-(1-naphthyl)-N-phenylamino]-p-terphenyl |
| ATA-3 | 4,4'-Bis[N-(2-naphthyl)-N-phenylamino]-biphenyl |
| ATA-4 | 4,4'-Bis[N-(3-acenaphthenyl)-N-phenylamino]biphenyl |
| ATA-5 | 1,5-Bis[N-(1-naphthyl)-N-phenylamino]-naphthalene |
| ATA-6 | 4,4'-Bis[N-(9-anthryl)-N-phenylamino]-biphenyl |
| ATA-7 | 4,4''-Bis[N-(1-anthryl)-N-phenylamino]-p-terphenyl |
| ATA-8 | 4,4'-Bis[N-(2-phenanthryl)-N-phenylamino]biphenyl |
| ATA-9 | 4,4'-Bis[N-(8-fluoranthenyl)-N-phenylamino]biphenyl |
| ATA-10 | 4,4'-Bis[N-(2-pyrenyl)-N-phenylamino]biphenyl |
| ATA-11 | 4,4'-Bis[N-(2-naphthacenyl)-N-phenylamino]biphenyl |
| ATA-12 | 4,4'-Bis[N-(2-perylenyl)-N-phenylamino]-biphenyl |
| ATA-13 | 4,4'-Bis[N-(1-coronenyl)-N-phenylamino]-biphenyl |
| ATA-14 | 2,6-Bis(di-p-tolylamino)naphthalene |
| ATA-15 | 2,6-Bis[di-(1-naphtyl)amino]naphthalene |
| ATA-16 | 2,6-Bis[N-(1-naphthyl)-N-(2-naphthyl)-amino]naphthalene |
| ATA-17 | N,N,N',N'-Tetra(2-naphthyl)-4,4''-diamino-p-terphenyl |
| ATA-18 | 4,4'-Bis{N-phenyl-N-[4-(1-naphthyl)-phenyl]amino}biphenyl |
| ATA-19 | 4,4'-Bis[N-phenyl-N-(2-pyrenyl)amino]-biphenyl |
| ATA-20 | 2,6-Bis[N,N-di(2-naphthyl)amine]fluorene |
| ATA-21 | 1,5-Bis[N-(1-naphthyl)-N-phenylamino]-naphthalene |

In the simplest contemplated construction of the device the entire hole injecting and transporting zone is formed of a single layer containing the selected (fused aromatic ring) tertiary amines described above. It is recognized that combinations of these tertiary amines as well as aromatic tertiary amines lacking fused aromatic rings can be employed together in separate layers. When combinations of aromatic tertiary amines are present in adjacent layers, it is preferred to place the amine having the lowest oxidation potential in contact with the anode. This layer then acts as a hole injecting layer.

The internal junction organic EL devices of this invention preferably contain the selected (fused aromatic ring) tertiary amines in a hole transporting layer contacting and forming a junction with the electron injecting and transporting zone and a hole injecting layer contacting the anode containing a porphyrinic compound forms the hole injecting zone of the organic EL device. A porphyrinic compound is any compound, natural or synthetic, which is derived from or includes a porphyrin structure, including porphine itself. Any of the porphyrinic compounds disclosed by Adler U.S. Pat. No. 3,935,031 or Tang U.S. Pat. No. 4,356,429, the disclosures of which are here incorporated by reference, can be employed.

Preferred porphyrinic compounds are those of structural formula (V):

wherein

Q is $-N=$ or $-C(R)=$;

M is a metal, metal oxide, or metal halide;

R is hydrogen, alkyl, aralkyl, aryl, or alkaryl, and $T^1$ and $T^2$ represent hydrogen or together complete a unsaturated 6 membered ring, which can include substituents, such as alkyl or halogen. Preferred 6 membered rings are those formed of carbon, sulfur, and nitrogen ring atoms. Preferred alkyl moieties contain from about 1 to 6 carbon atoms while phenyl constitutes a preferred aryl moiety.

In an alternative preferred form the porphyrinic compounds differ from those of structural formula (V) by substitution of two hydrogen for the metal atom, as indicated by formula (VI):

(VI)

Highly preferred examples of useful porphyrinic compounds are metal free phthalocyanines and metal containing phthalocyanines. While the porphyrinic compounds in general and the phthalo cyanines in particular can contain any metal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:

| | |
|---|---|
| PC-1 | Porphine |
| PC-2 | 1,10,15,20-Tetraphenyl-21H,23H-porphine copper (II) |
| PC-3 | 1,10,15,20-Tetraphenyl-21H,23H-porphine zinc (II) |
| PC-4 | 5,10,15,20-Tetrakis(pentafluorophenyl)-21H,23H-porphine |
| PC-5 | Silicon phthalocyanine oxide |
| PC-6 | Aluminum phthalocyanine chloride |
| PC-7 | Phthalocyanine (metal free) |
| PC-8 | Dilithium phthalocyanine |
| PC-9 | Copper tetramethylphthalocyanine |
| PC-10 | Copper phthalocyanine |
| PC-11 | Chromium phthalocyanine fluoride |
| PC-12 | Zinc phthalocyanine |
| PC-13 | Lead phthalocyanine |
| PC-14 | Titanium phthalocyanine oxide |
| PC-15 | Magnesium phthalocyanine |
| PC-16 | Copper octamethylphthalocyanine |

Any conventional electron injecting and transporting compound or compounds can be employed in forming the layer of the organic electroluminescent medium adjacent the cathode. This layer can be formed by historically taught luminescent materials, such as anthracene, naphthalene, phenanthrene, pyrene, chrysene, and perylene and other fused ring luminescent materials containing up to about 8 fused rings as illustrated by Gurnee et al U.S. Pat. No. 3,172,862, Gurnee U.S. Pat. No. 3,173,050, Dresner, "Double Injection Electroluminescence in Anthracene", RCA Review, Vol. 30, pp. 322-334, 1969; and Dresner U.S. Pat. No. 3,710,167, cited above. Although such fused ring luminescent materials do not lend themselves to forming thin (<1 μm) films and therefore do not lend themselves to achieving the highest attainable EL device performance levels, organic EL devices incorporating such luminescent materials when constructed according to the invention show improvements in performance and stability over otherwise comparable prior art EL devices.

Among electron transporting compounds useful in forming thin films are the butadienes, such as 1,4-diphenylbutadiene and tetraphenylbutadiene; coumarins; and stilbenes, such as trans-stilbene, disclosed by Tang U.S. Pat. No. 4,356,429, cited above.

Still other thin film forming electron transporting compounds which can be used to form the layer adjacent the cathode are optical brighteners, particularly those disclosed by VanSlyke et al U.S. Pat. No. 4,539,507, cited above and here incorporated by reference. Useful optical brighteners include those satisfying structural formulae (VII) and (VIII):

wherein
$R^1$, $R^2$, $R^3$, and $R^4$ are individually hydrogen; saturated aliphatic of from 1 to 10 carbon atoms, for example, propyl, t-butyl, heptyl, and the like., aryl of from 6 to 10 carbon atoms, for example, phenyl and naphthyl; or halo such as chloro, fluoro, and the like; or $R^1$ and $R^2$ or $R^3$ and $R^4$ taken together comprise the atoms necessary to complete a fused aromatic ring optionally bearing at least one saturated aliphatic of from 1 to 10 carbon atoms, such as methyl, ethyl, propyl and the like;

$R^5$ is a saturated aliphatic of from 1 to 20 carbon atoms, such as methyl, ethyl, n-eicosyl, and the like; aryl of from 6 to 10 carbon atoms, for example, phenyl and naphthyl; carboxyl; hydrogen; cyano; or halo, for example, chloro, fluoro and the like; provided that in formula (VIII) at least two of $R^3$, $R^4$ and $R^5$ are saturated aliphatic of from 3 to 10 carbon atoms, e.g., propyl, butyl, heptyl and the like;

Z is —O—, —NH—, or —S—; and
Y is wherein m is an integer of from 0 to 4;

n is arylene of from 6 to 10 carbon atoms, for example, phenylene and naphthylene; and Z' and Z" are individually N or CH. As used herein "aliphatic" includes substituted aliphatic as well as unsubstituted aliphatic. The substituents in the case of substituted aliphatic include alkyl of from 1 to 5 carbon atoms, for example, methyl, ethyl, propyl and the like; aryl of from 6 to 10 carbon atoms, for example, phenyl and naphthyl; halo, such as chloro, fluoro and the like; nitro; and alkoxy having 1 to 5 carbon atoms, for example, methoxy, ethoxy, propoxy, and the like.

Still other optical brighteners that are contemplated to be useful are listed in Vol. 5 of *Chemistry of Synthetic Dyes*, 1971, pages 618-637 and 640. Those that are not already thin film forming can be rendered so by attaching an aliphatic moiety to one or both end rings.

Particularly preferred thin film forming materials for use in forming the electron injecting and transporting layers of the organic EL devices of this inventions are metal chelated oxinoid compounds, including chelates of oxine itself (also commonly referred to as 8 quinolinol or 8 hydroxyquinoline). Such compounds exhibit both high levels of performance and are readily fabricated in the form of thin films. Exemplary of contemplated oxinoid compounds are those satisfying structural formula (IX):

wherein

Me represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds are the following:

| | |
|---|---|
| CO-1 | Aluminum trisoxine |
| | [a.k.a., tris(8-quinolinol) aluminum] |
| CO-2 | Magnesium bisoxine |
| | [a.k.a., bis(8-quinolinol) magnesium] |
| CO-3 | Bis[benzo{f}-8-quinolinol] zinc |
| CO-4 | Tris(2-methyl-8-quinolinolato) aluminum |
| CO-5 | Indium trisoxine |
| | [a.k.a., tris(8-quinolinol)indium] |
| CO-6 | Aluminum tris(5-methyloxine) |
| | [a.k.a., tris(5-methyl-8-quinolinol) aluminum |
| CO-7 | Lithium oxine |
| | (a.k.a., 8-quinolinol lithium] |
| CO-8 | Gallium tris(5-chlorooxine) |
| | [a.k.a, tris(5-chloro-8-quinolinol) gallium] |
| CO-9 | Calcium bis(5-chlorooxine) |
| | [a.k.a, bis(5-chloro-8-quinolinol) calcium] |
| CO-10 | Poly[zinc (II)-bis(8-hydroxy-5-quinolinyl)methane] |
| CO-11 | Dilithium epindolidione |

It is possible to modify the wavelength of emission from the electron injecting and transporting zone and, in some instances, to increase the stability of the organic EL device in operation by incorporating in the electron injecting and transporting zone a dye capable of emitting light in response to hole-electron recombination. To be useful for this purpose the dye must have a bandgap no larger than that of the host material in which it is dispersed and a reduction potential less negative than that of the host material. Tang et al U.S. Pat. No. 4,769,292, the disclosure of which is here incorporated by reference, describes internal junction organic EL devices containing dyes selected form a variety of classes dispersed in electron injecting and transporting zone host materials.

In the internal junction organic EL devices of the invention it is possible to maintain a current density compatible with efficient light emission while employing a relatively low voltage across the electrodes by limiting the total thickness of the organic electroluminescent medium to less than 1 μm (10,000 Angstroms). At a thickness of less than 1 μm an applied voltage of 20 volts results in a field potential of greater than $2 \times 10^5$ volts/cm, which is compatible with efficient light emission. An order of magnitude reduction (to 0.1 μm or 1000 Angstroms) in thickness of the organic electroluminescent medium, allowing further reductions in applied voltage and/or increase in the field potential and hence current density, are well within device construction capabilities.

One function which the organic electroluminescent medium performs is to provide a dielectric barrier to prevent shorting of the electrodes on electrical biasing of the EL device. Even a single pin hole extending through the organic electroluminescent medium will allow shorting to occur. Unlike conventional EL devices employing a single highly crystalline electroluminescent material, such as anthracene, for example, the internal junction organic EL devices of this invention are capable of fabrication at very low overall organic electroluminescent medium thicknesses without shorting. One reason is that the presence of two or three superimposed layers greatly reduces the chance of pin holes in the layers being aligned to provide a continuous conduction path between the electrodes. This in itself permits one or even two of the layers of the organic electroluminescent medium to be formed of materials which are not ideally suited for film formation on coating while still achieving acceptable EL device performance and reliability.

The preferred materials for forming the organic electroluminescent medium are each capable of fabrication in the form of a thin film—that is, capable of being fabricated as a continuous layer having a thickness of less than 0.5 μm or 5000 Angstroms.

When one or more of the layers of the organic electroluminescent medium are solvent coated, a film forming polymeric binder can be conveniently codeposited with the active material to assure a continuous layer free of structural defects, such as pin holes. If employed, a binder must, of course, itself exhibit a high dielectric strength, preferably at least about $2 \times 10^6$ volt/cm. Suitable polymers can be chosen from a wide variety of known solvent cast addition and condensation polymers. Illustrative of suitable addition polymers are polymers and copolymers (including terpolymers) of styrene, t-butylstyrene, N-vinyl carbazole, vinyltoluene, methyl methacrylate, methyl acrylate, acrylonitrile, and vinyl acetate. Illustrative of suitable condensation polymers are polyesters, polycarbonates, polyimides, and polysulfones. To avoid unnecessary dilution of the active material, binders are preferably limited to less than 50 percent by weight, based on the total weight of the material forming the layer.

The preferred active materials forming the organic electroluminescent medium are each film forming materials and capable of vacuum vapor deposition. Extremely thin defect free continuous layers can be formed by vacuum vapor deposition. Specifically, individual layer thicknesses as low as about 50 Angstroms can be present while still realizing satisfactory EL device performance. Employing a vacuum vapor deposited porphorinic compound as a hole injecting layer, a film forming aromatic tertiary amine as a hole transporting layer (which can in turn be comprised of a triarylamine layer and a tetraaryldiamine layer), and a chelated oxinoid compound as an electron injecting and transporting layer, individual layer thicknesses in the range of from about 50 to 5000 Angstroms are contemplated, with layer thicknesses in the range of from 100 to 2000 Angstroms being preferred. It is generally preferred that the overall thickness of the organic electroluminescent medium be at least about 1000 Angstroms.

The anode and cathode of the internal junction organic EL device can each take any convenient conventional form, such as any of the various forms disclosed by Tang et al U.S. Pat. No. 4,885,211, the disclosure of which is here incorporated by reference. Preferred transparent anodes are formed of a conductive oxide, such as indium tin oxide (ITO). When the anode is not intended to be conductive, it can be formed of any of a wide range of metals having a work function of at least 4.0 eV. The preferred cathodes are those constructed of a combination of a metal having a work function less than 4.0 eV and one other metal, preferably a metal having a work function greater than 4.0 eV. The high and low work function metals can be employed in extremely wide proportions, ranging much <1 percent to >99 percent of the work function metal with another metal, preferably a higher work function metal (e.g., a metal having a work function >4.0 eV), forming the balance of the cathode. The Mg:Ag cathodes of Tang et al U.S. Pat. No. 4,885,211, constitute one preferred cathode construction. Aluminum and magnesium cathodes with magnesium constituting at least 0.05 (preferably at least 0.1) percent and aluminum constituting at least 80 (preferably at least 90) percent constitute another preferred cathode construction. The aluminum and magnesium cathodes are the subject matter of the VanSlyke et al (I) concurrently filed patent application disclosed above.

EXAMPLES

The invention and its advantages are further illustrated by the specific examples which follow. The term "atomic percent" indicates the percentage of a particular metal present, based on the total number of metal atoms present. In other words, it is analogous to mole percent, but is based on atoms rather than molecules. The term "cell" as employed in the examples denotes an organic EL device. Examples with a number bearing the suffix E represent embodiments of the invention while Examples with a number bearing the suffix C are included for the purpose of comparing variations.

EXAMPLE 1E A Preferred Cell Construction

An internal junction organic EL device satisfying the requirements of the invention was constructed in the following manner:

a) A transparent anode of indium tin oxide coated glass was ultrasonicated in a commercial detergent, rinsed in deionized water, degreased in toluene vapor and contacted with a strong oxidizing agent.

b) A hole injecting PC-10 (375 Å) layer was deposited on the anode by vacuum deposition. PC-10 was evaporated from a tantalum boat.

c) A hole transporting ATA-1 (375 Å) layer was then deposited on top of the PC-10 layer. ATA-1 was also evaporated from a tantalum boat.

d) An electron injecting and transporting CO-1 (600 Å) layer was then deposited on top of the ATA-1 layer. CO-1 was also evaporated from a tantalum boat.

e) On top of the CO-1 layer was deposited a 2000 Å cathode formed of a 10:1 atomic ratio of Mg and A-g.

The stability of the cell produced was evaluated using a constant current of 20 mA/cm$^2$ with a positive potential applied to the anode and the cathode attached to ground. The initial intensity was 0.44 mW/cm$^2$, a level which is well in excess of that required for display applications. Setting initial intensity at a normalized value of 1.0, relative output over a period of 400 hours is shown in Table I. Table II shows the reduction of intensity over the first 50 hours of operation and over the entire 400 hours of operation.

EXAMPLES 2E-4E, 5C and 6C Varied Hole Transporting Layers

Example 1 was repeated, but with different aromatic tertiary amines substituted for ATA-1. Initial light outputs, measured in mW//cm$^2$, were 0.32 (2E); 0.44 (3E); 0.24 (4E); 0.32 (5C) and 0.38 (6C) performances as a function of duration of operation are summarized in Tables I and II.

TABLE I

| Cell | ATA | Normalized Light Output | | | | | |
|------|-----|---|---|---|---|---|---|
|      |     | 0 | 50 | 100 | 200 | 300 | 400 (hrs.) |
| Ex. 1E | 1  | 1.0 | 0.92 | 0.88 | 0.81 | 0.75 | 0.72 |
| Ex. 2E | 3  | 1.0 | 0.84 | 0.77 | 0.69 | 0.62 | 0.58 |
| Ex. 3E | 6  | 1.0 | 0.88 | 0.82 | 0.78 | 0.72 | 0.69 |
| Ex. 4E | 14 | 1.0 | 0.90 | 0.86 | 0.78 | 0.72 | 0.68 |
| Ex. 5C | C1 | 1.0 | 0.62 | 0.57 | 0.51 | 0.46 | 0.43* |
| Ex. 6C | C2 | 1.0 | 0.82 | 0.75 | 0.62 | 0.53 | 0.46 |

*Extrapolated from 375 hrs. of operation
C1 4,4'-Bis(di-p-tolylamino)biphenyl
C2 Bis(N-1-naphthyl)(N-2-naphthyl)amine

TABLE II

| Cell | Normalized Decline in Light Output | | |
|---|---|---|---|
| | ATA | Δ 0–50 hours | Δ 0–400 hours |
| Ex. 1E | 1 | 0.08 | 0.28 |
| Ex. 2E | 3 | 0.16 | 0.42 |
| Ex. 3E | 6 | 0.12 | 0.30 |
| Ex. 4E | 14 | 0.10 | 0.32 |
| Ex. 5C | C1 | 0.38 | 0.57* |
| Ex. 6C | C2 | 0.18 | 0.54 |

*Extrapolated from 375 hrs. of operation
C1 4,4'-Bis(di-p-tolylamino)biphenyl
C2 Bis(N-1-naphthyl)(N-2-naphthyl)amine From Tables I and II the superior stabilities of the internal junction organic EL devices of the invention is clearly apparent. The cells of the invention lose a lower percentage of their initial intensity during their first 50 hours of operation. Further, the cells of the invention exhibit a much higher percentage of their initial intensity after 400 hours of operation. Example 5C demonstrates that the presence of an amine substituent having two fused aromatic rings is required to obtain high levels of stability in the first few hours of operation. Example 6C demonstrates that more than one amine group is required to maintain high levels of stability over an extended period, even when one or more amine substituents are present containing two or more fused aromatic rings.

The invention has been described in detail with particular reference to preferred embodiments thereof, but it will be understood that variations and modifications can be effected within the spirit and scope of the invention.

What is claimed is:

1. An internal junction organic electroluminescent device comprising in sequence, an anode, an organic hole injecting and transporting zone comprised of a layer containing a hole transporting aromatic tertiary amine, an organic electron injecting and transporting zone, and a cathode, characterized in that
said hole transporting aromatic tertiary amine is comprised of at least two tertiary amine moieties and includes attached to a tertiary amine nitrogen atom an aromatic moiety containing at least two fused aromatic rings.

2. An internal junction organic electroluminescent device according to claim 1 further characterized in that said aromatic tertiary amine includes at least two aromatic groups attached to a tertiary amine nitrogen atom.

3. An internal junction organic electroluminescent device according to claim 2 further characterized in that said two aromatic groups each consist of an aromatic moiety containing at least two fused aromatic rings.

4. An internal junction organic electroluminescent device according to claim 2 further characterized in that said aromatic tertiary amine includes attached to a tertiary amine nitrogen atom three aromatic groups.

5. An internal junction organic electroluminescent device according to claim 4 further characterized in that said three aromatic groups each consist of an aromatic moiety containing at least two two fused aromatic rings.

6. An internal junction organic electroluminescent device according to claim 1 further characterized in that said aromatic tertiary amine includes at least two tertiary amine nitrogen atoms linked through a divalent aromatic moiety.

7. An internal junction organic electroluminescent device according to claim 6 further characterized in that said divalent aromatic moiety contains at least two fused aromatic rings.

8. An internal junction organic electroluminescent device according to claim 7 further characterized in that said tertiary amine nitrogen atoms are each linked to an aromatic moiety containing at least two fused aromatic rings.

9. An internal junction organic electroluminescent device according to claim 1 further characterized in that said aromatic moiety contains from 10 to 24 ring carbon atoms.

10. An internal junction organic electroluminescent device according to claim 9 further characterized in that said aromatic moiety contains from 10 to 16 carbon atoms.

11. An internal junction organic electroluminescent device according to claim 1 further characterized in that said aromatic moiety containing at least two fused aromatic rings is a naphthyl moiety.

12. An internal junction organic electroluminescent device according to claim 1 further characterized in that said aromatic tertiary amine satisfies the structural formula:

wherein
$Q^1$ and $Q^2$ are independently aromatic tertiary amine moieties and
G is a carbon to carbon bond or a linking group chosen from the class consisting of cycloalkylene having 5 to 7 ring carbon atoms, alkylene having from 1 to 6 carbon atoms, and a divalent arylene moiety consisting of at least one phenylene group or a naphthylene moiety.

13. An internal junction organic electroluminescent device according to claim 12 further characterized in that said aromatic tertiary amine is a triarylamine satisfying the structural formula:

where
$R^1$ and $R^2$ each independently represent a hydrogen atom, an aryl group, or an alkyl group of from 1 to 6 carbon atoms or $R^1$ and $R^2$ together represent the atoms completing a cycloalkyl group containing from 5 to 7 ring carbon atoms and
$R^3$ and $R^4$ each independently represent an aryl group which is in turn substituted with a diarylamino group, as indicated by the structural formula:

wherein R[5] and R[6] are independently selected aryl groups,
said aryl groups being independently chosen from the group consisting of phenyl, biphenyl and naphthyl moieties and at least one of said aryl groups being a naphthyl moiety.

14. An electroluminescent device according to claim 1 in which said aromatic tertiary amine is a tetraaryldiamine wherein the aryl groups are independently chosen from the group consisting of phenyl, biphenyl and naphthyl moieties and at least one of said aryl moieties is a naphthyl moiety.

15. An electroluminescent device according to claim 14 further characterized in that said tetraaryldiamine satisfies the formula:

wherein
Ar, Ar[1], Ar[2] and Ar[3] are independently selected from among phenyl, biphenyl and naphthyl moieties,
L is a divalent naphthylene moiety or $\phi_n$,
$\phi$ is a phenylene moiety,
n is an integer of from 1 to 4, and
at least one of Ar, Ar[1], Ar[2] and Ar[3] is a naphthyl moiety when L is $\phi_n$.

16. An internal junction organic electroluminescent device according to claim 15 further characterized in that said tetraarylamine is chosen from the class consisting of
4,4'-bis[N-(1-naphthyl)-N-phenylamino]biphenyl;
4,4''-bis[N-(1-naphthyl)-N-phenylamino]-p-terphenyl;
4,4'-bis[N-(2-naphthyl)-N-phenylamino]biphenyl;
4,4'-bis[N-(3-acenaphthenyl)-N-phenylamino]biphenyl;
1,5-bis[N-(1-naphthyl)-N-phenylamino]naphthalene;
4,4'-bis[N-(9-anthryl)-N-phenylamino]biphenyl;
4,4''-bis[N-(1-anthryl)-N-phenylamino]-p-terphenyl;
4,4'-bis[N-(2-phenanthryl)-N-phenylamino]biphenyl;
4,4'-bis[N-(8-fluoranthenyl)-N-phenylamino]biphenyl;
4,4'-bis[N-(2-pyrenyl)-N-phenylamino]biphenyl;
4,4'-bis[N-(2 naphthacenyl)-N-phenylamino]biphenyl;
4,4'-bis[N-(2 perylenyl)-N-phenylamino]biphenyl;
4,4'-bis[N-(1-coronenyl)-N-phenylamino]biphenyl;
2,6-bis(di-p-tolylamino)naphthalene;
2,6-bis[di-(1-naphtyl)amino]naphthalene;
2,6-bis[N-(1-naphthyl)-N-(2-naphthyl)amino]naphthalene;
N,N,N',N'-tetra(2 naphthyl) 4,4'''-diamino-p-terphenyl;
4,4'-bis{N-phenyl-N-[4-(1-naphthyl)phenyl]-amino}biphenyl;
4,4'-bis[N-phenyl-N-(2-pyrenyl)amino]biphenyl;
2,6-bis[N,N-di(2-naphthyl)amine]fluorene; and
1,5-bis[N-(1-naphthyl)-N-phenylamino]naphthalene.

17. An internal junction organic electroluminescent device according to claim 1 further characterized in that said hole injecting and transporting zone is comprised of
a hole injecting layer contacting said cathode and a hole transporting layer containing said tertiary amine.

18. An internal junction organic electroluminescent device according to claim 17 further characterized in that said hole injecting layer contains a hole injecting porphorinic compound.

19. An internal junction organic electroluminescent device according to claim 18 in which said porphorinic compound is a metal containing porphorinic compound which satisfies the structural formula:

wherein
Q is —N= or —C(R)=;
M is a metal, metal oxide, or metal halide.,
R is hydrogen, alkyl, phenalkyl, phenyl, or alkylphenyl, each alkyl moiety containing from 1 to 6 carbon atoms, and
T[1] and T[2] represent hydrogen or together complete a unsaturated 6 membered ring containing ring atoms chosen from the group consisting of carbon, nitrogen, and sulfur atoms.

20. An internal junction organic electroluminescent device according to claim 18 in which said porphorinic compound is a metal free porphorinic compound which satisfies the structural formula:

wherein
Q is —N= or —C(R)=;
R is hydrogen, alkyl, phenalkyl, phenyl, or alkylphenyl, each alkyl moiety containing from 1 to 6 carbon atoms, and $T^1$ and $T^2$ represent hydrogen or together complete a unsaturated 6 membered ring containing ring atoms chosen from the group consisting of carbon, nitrogen, and sulfur atoms.

21. An internal junction organic electroluminescent device according to claim 1 in which said electron injecting and transporting zone is comprised of a stilbene or chelated oxinoid compound.

22. An internal junction organic electroluminescent device according to claim 21 in which said chelated oxinoid compound is represented by the formula:

wherein
Me represents a metal;
n is an integer of from 1 to 3; and
Z independently in each occurrence represents the atoms completing a nucleus having at least two fused aromatic rings.

* * * * *